United States Patent [19]

Dravida

[11] Patent Number: 5,131,012
[45] Date of Patent: Jul. 14, 1992

[54] SYNCHRONIZATION FOR CYLIC REDUNDANCY CHECK BASED, BROADBAND COMMUNICATIONS NETWORK

[75] Inventor: Subrahmanyam Dravida, Toms River, Ocean County, N.J.

[73] Assignee: AT&T Bell Laboratories, Murray Hill, N.J.

[21] Appl. No.: 584,323

[22] Filed: Sep. 18, 1990

[51] Int. Cl.[5] .............................................. H04L 7/00
[52] U.S. Cl. ..................................... 375/108; 371/42; 371/47.1
[58] Field of Search ................. 371/37.1, 42, 46, 47.1; 370/105, 105.4, 106; 375/108, 114, 116

[56] References Cited

U.S. PATENT DOCUMENTS

| | | | |
|---|---|---|---|
| 4,316,284 | 2/1982 | Howson | 370/105 |
| 4,316,285 | 2/1982 | Bobilin | 370/105 |
| 4,720,830 | 1/1988 | Joshi et al. | 371/37.1 |
| 5,005,191 | 4/1991 | O'Connor et al. | 375/114 |
| 5,018,171 | 5/1991 | Perloff et al. | 375/108 |

OTHER PUBLICATIONS

Distributed Queue Daul Bus (DQDB) Subnetwork of a Metropolitan Area Network (MAN), IEEE Project 802 Local and Metropolitan Area Networks, Jul. 13, 1990, pp. 173-177.
Preserving the Integrity of Cyclic-Redundancy Checks When Protected Text Is Intentionally Altered, *IBM Journal of Research and Development*, vol. 33, No. 6, pp. 601-674, Nov. 1989.

*Primary Examiner*—Benedict V. Safourek
*Attorney, Agent, or Firm*—T. Stafford

[57] ABSTRACT

A received digital signal is synchronized with a receiver in a communications network by employing a code word which is updated in accordance with a unique update technique. The synchronization arrangement receives the digital signal at a receiver, generates an error check code word over a prescribed portion of the received digital signal and compares the generated error check code word with an expected error check code word in the received digital signal. In response to the comparison result, the generation of the code word and the comparison is iteratged until synchronization is obtained. A new code word is generated as a function of a modified version of the last previously generated code word (previous code word), a function term based on a set of bits dropped from the prescribed portion of the received digital signal, and a set of bits added to the prescribed portion of the received digital signal. In one embodiment, a cyclic redundancy check (CRC) code word is employed. In one instance, the modified version of the code word is obtained by shifting the previous code word to the left dependent on the lead set of bits in the previous code word. In another instance, the modified version of the code word is obtained by shifting the previous code word to the left and then adding the CRC generator polynomial to it, also dependent on the lead set of bits in the previous code word. The function term is representative of a remainder obtained by modifying the dropped set of bits in a predetermined manner and by dividing the modified dropped set of bits by a prescribed CRC generator polynomial. The new CRC code word is then obtained by adding the modified version of the previous code word, the function term and the set of added bits.

22 Claims, 4 Drawing Sheets

SYNCHRONIZATION FOR CYLIC REDUNDANCY CHECK BASED, BROADBAND COMMUNICATIONS NETWORK

CROSS-REFERENCE TO RELATED APPLICATION

U.S. patent application Ser. No. 07/584,211 was filed concurrently herewith.

TECHNICAL FIELD

This invention relates to communications networks and, more particularly, to synchronization in a communications network.

BACKGROUND OF THE INVENTION

In digital communications networks it is generally necessary that the sending end of the network and the receiving end of the network be synchronized in order to recover the transmitted information.

Synchronization techniques are known for time division multiplexed (TDM) digital transmission systems. Some such techniques have been proposed. See, for example, U.S. Pat. No. 4,316,284, which is entitled "Frame Resynchronization Circuit for Digital Receiver" and which issued to R. D. Howson on Feb. 16, 1982, as well as U.S. Pat. No. 4,316,285, which is entitled "Frame Circuit for Digital Receiver" and which issued to R. T. Bobilin et al. on Feb. 16, 1982.

It is known that, in time division multiplexing (TDM) systems, digital information is transmitted in frames and synchronization is realized by properly locating the frames by a process called framing in which the sending end and the receiving end recognize the same frame boundaries, i.e. recognize the same first bit of a frame through the same last bit of the frame.

In the cited U.S. Pat. No. 4,316,284, for example, bits of a received time division signal are compared with bits of a code word generated in accordance with a prescribed criterion from the received time division signal to, thereupon, generate code word error indications. The reframing process is iterated until the receiver is synchronized on a framing bit pattern for which there is no code word error indication generated. That is, the received signal is monitored to determine whether code word bits inserted in the time division signal match code word bits that are locally generated in the receiver from the received time division signal. The U.S. Pat. No. 4,316,284 discloses, in one example, the use of a six bit cyclic redundancy check (CRC) code word. The CRC code word is employed with the code word bits being inserted in predetermined ones of the framing bit positions of the time division signal.

In packet communications networks, it is known to employ an error check sequence in an attempt to maintain end-to-end integrity of transported packets. It is possible that the error check sequence can be used in a manner disclosed in the U.S. Pat. Nos. 4,316,284 and 4,316,285 to realize synchronization.

Notwithstanding, in the process of framing, as the bit or group of bits is slipped, the code word is generated over the whole frame or other predetermined portion of the received signal, which involves time and, hence, needs additional speed improvement. Accordingly, it remains desirable to improve synchronization methodology in a communications network to mitigate such problems.

SUMMARY OF THE INVENTION

The problems of prior digital synchronization arrangements are overcome, in accordance with the invention, by generating a code word in a receiving terminal or node in accordance with a unique update technique. To this end, a code word is generated over a prescribed portion of a received signal and is compared with an expected code word in the received signal. If a match is not obtained, a set of bits is dropped from the prescribed portion of the signal and a new set of bits is added. Then, a new code word is generated as a function of the last previously generated code word (previous code word), the dropped set of bits and the added set of bits. The set of bits can include one (1) or more bits. Thereafter, the comparison and code word generation are iterated until a match is obtained indicating synchronization of the received signal.

In one embodiment of the invention, a cyclic redundancy check (CRC) code word is advantageously employed for obtaining synchronization. A CRC code word is generated over the predetermined portion of the received signal. Then, new CRC code words are generated as a unique function of the previous CRC code word, a dropped set of bits and an added set of bits. The new CRC code word is obtained by generating a modified version of the previous CRC code word, generating a function term corresponding to the dropped set of bits and adding the modified CRC code word version, the function term and the added set of bits. In one instance, the modified CRC code word version is obtained by shifting the previous CRC code word to the left dependent on the lead set of bits of the previous CRC code word. In another instance, the modified CRC code word version is obtained by shifting the previous CRC code word to the left and adding the CRC generator polynomial to the shifted code word, also dependent on the lead set of bits in the previous CRC code word. The function term is representative of a remainder obtained by modifying the dropped set of bits in a predetermined manner and by dividing the modified version thereof by a prescribed CRC generator polynomial.

In one example, the dropped set of bits is modified by multiplying it by a predetermined polynomial to obtain the function term.

In an exemplary embodiment, the predetermined multiplying polynomial is a mononomial.

DETAILED DESCRIPTION

Figure 1:
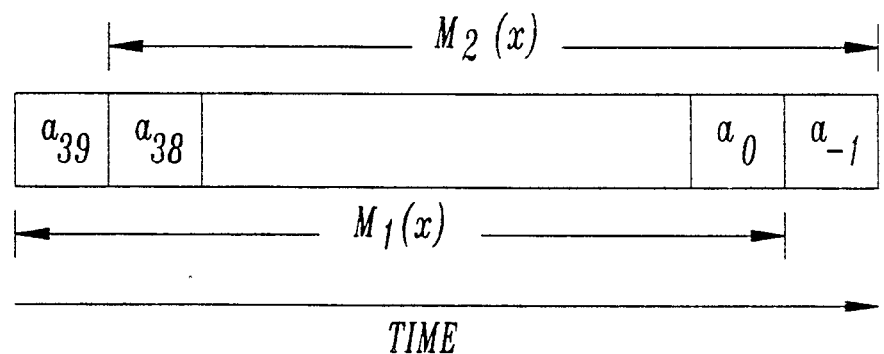
FIG. 1 is a block diagram illustrating a time relationship between a first message and a second message wherein there is a slip of one bit between the messages and is useful in describing an illustrative embodiment of the principles of my invention.

The prior art employs a cyclic redundancy check (CRC) code word in an arrangement for synchronizing a frame with a receiver in a digital transmission system. My advance in the art relates not only to extending the use of a CRC code word for use in an arrangement for synchronizing a packet with a receiver in a communications network but also, and more generally, for improving the speed with which code words are locally generated at a receiver from the received frame or the received packet or other received digital signal.

Some theoretical foundation, which is now addressed, will be useful is understanding the principles of my invention. Assume that a new header field coupled with the information field, i.e. the message, would consist of N bits. Also, assume that the message can be viewed as a message polynomial $M(x)$ in a dummy variable x with N terms and, hence, as a polynomial of degree $N-1$. For example, consider a combination of header field and information field, which consists of twelve bits, i.e. $N=12$, and which may be represented as a message bit stream such as 100100011011. The message bit stream could be represented by a message polynomial $M(x)$ of the form:

$$M(x) = 1 \cdot x^{11} + 0 \cdot x^{10} + 0 \cdot x^9 + 1 \cdot x^8 + 0 \cdot x^7 + 0 \cdot x^6 + 0 \cdot x^5 + 1 \cdot x^4 + 1 \cdot x^3 + 0 \cdot x^2 + 1 \cdot x^1 + 1 \cdot x^0 \quad (1)$$

The message polynomial of equation (1) can rewritten in a shorten form as:

$$M(x) = x^{11} + x^8 + x^4 + x^3 + x^1 + 1 \quad (2)$$

The CRC code word can be generated by multiplying the message polynomial $M(x)$ by $x^K$ and dividing the product by a generator polynomial $P(x)$, where K is the number of bits, which comprise the CRC code word field. Multiplication by $x^K$ effectively shifts the message polynomial $M(x)$ exactly K places to the left.

As to generator polynomials, which are known in the art, the degree of $P(x)$ is generally greater than zero but less than the degree of $M(x)$. The generator polynomial also has a non-zero coefficient in the $x^0$ term. Further, although there are many possible generator polynomials, the designers of a communications network generally select one generator polynomial $P(x)$ for use throughout the network, typically, with an expectation of achieving certain performance objectives relative to error detection and error correction. The following is a nonexhaustive list of examples of generator polynomials for CRC codes, which have the capability of correcting single errors where N is less than 64:

$$P(x) = x^6 + x^5 + 1 \quad (3)$$

or $$P(x) = x^7 + x^6 + x^2 + 1 \quad (4)$$

or $$i \; P(x) = x^8 + x^2 + x^1 + 1 \quad (5)$$

or $$P(x) = x^9 + x^6 + x^1 + 1 \quad (6)$$

or $$P(x) = x^{10} + x^6 + x^1 + 1 \quad (7)$$

Even with the foregoing as background, some additional theoretical background will be helpful for purposes of understanding some basics that are useful in describing an illustrative embodiment of the principles of my invention.

Let, the product resulting from the multiplication of message polynomial $M(x)$ by $x^K$ be called a "shifted message polynomial", $M_1(x)$. Then let $R_1(x)$ be the remainder obtained after dividing the "shifted message polynomial" $M_1(x)$ by the generator polynomial $P(x)$, or:

$$R_1(x) = \left[ \frac{M_1(x)}{P(x)} \right]. \quad (8)$$

The CRC code word is then, by definition, the remainder $R_1(x)$.

Then, suppose $R_2(x)$ is the remainder obtained by dividing another shifted message polynomial $M_2(x)$ by the same generator polynomial $P(x)$, or:

$$R_2(x) = \left[ \frac{M_2(x)}{P(x)} \right]. \quad (9)$$

The CRC code word is then also the remainder $R_2(x)$.

We now introduce some more theory. Based on this and the foregoing theory, a methodology can be developed to update the previously generated CRC code word to account for the exclusion of the first bit and the inclusion of a new bit, which is a result flowing from the slipping of a bit.

Assume a message polynomial $M_1(x)$ consists of $(N=)$ 32 bits and the CRC code word field consists of $(K=)$ 8 check bits. Then a total of 40 bits would have to be checked to determine whether of not, on slipping a bit by bit basis, synchronization is obtained. If synchronization is not obtained on a first match attempt, the packet could be slipped by a set of bits and the CRC code word comparison process could be performed again on a second match attempt, etc. The set can include one (1) or more bits.

Now and referring to FIG. 1, let $M_1(x)$ represent the original $(N=)$ 40 bits in polynomial form such as:

$$M_1(x) = \sum_{i=0}^{39} a_i x^i \quad (10)$$

$$= a_{39} x^{39} + \sum_{i=0}^{38} a_i x^i \quad (11)$$

where $a_i$ is either a binary one or a binary zero and, in a temporal or time wise sense the i-th bit occurs after the (i+1)-st bit. Also, let $M_2(x)$ be the message polynomial representation of equation (10) when equation (10) is shifted to the right by one bit, i.e. when the message polynomial $M_1(x)$ has slipped one bit to the right. That is, $$M_2(x) = x \sum_{i=0}^{38} a_i x^i + a_{-1}, \quad (12)$$

where $a_{-1}$ is the next in a temporal sense or time wise new bit that will need to be accounted for in the generation of a new CRC code word. Note also that $a_{39}$, which is the first bit of $M_1(x)$, is no longer a part of $M_2(x)$. Accordingly, $M_2(x)$ can be rewritten as, $$M_2(x) = xM_1(x) + a_{39}x^{40} + a_{-1} \tag{13}$$

Recall that $R_2(x)$ is the remainder obtained after dividing $M_2(x)$ by the generator polynomial $P(x)$ and that $R_1$ is the remainder after dividing $M_1(x)$ by the same generator polynomial $P(x)$.

Since the remainder operator is linear, we have from equation (13), $$R_2(x) = \left\lfloor \frac{xM(x)}{P(x)} \right\rfloor + \left\lfloor \frac{a_{39}x^{40} + a_{-1}}{P(x)} \right\rfloor. \tag{14}$$

Since $a_{-1}$ is of degree zero, i.e. is itself multiplied by $x^0$, it follows that dividing $a_{-1}$ by $P(x)$ yields $a_{-1}$. Next, a function term U given as $$(U = ) \left\lfloor \frac{a_{39}x^{40}}{P(x)} \right\rfloor$$

can be precomputed and stored in a memory. Since $a_{39}$ can take either of two values, i.e. either binary 0 or binary one, the memory consists of two memory locations, each, in this illustrative example, being sufficient to store an eight bit word. However, note that, when $a_{39}$ is a zero, the function term U is equal to zero, which need not be actually stored in a memory. Hence, the two memory locations can reduce to a single memory location for use in updating when $a_{39}$ is a one.

From the general definition of a remainder $R(x)$, we have:

$$M(x) = q(x)P(x) + R(x), \tag{15}$$

where $q(x)$ is a quotient polynomial. Now, multiplying equation (15) by x and dividing the product by the generator polynomial $P(x)$, we have:

$$\left\lfloor \frac{xM(x)}{P(x)} \right\rfloor = \left\lfloor \frac{xR(x)}{P(x)} \right\rfloor. \tag{16}$$

Since $R(x)$ is of degree $(K-1)$, the product $xR(x)$ is of degree K. Exactly, indeed, for that matter, only, one division operation needs to be performed to obtain the remainder represented by equation (16).

Now consider the remainder $R_1(x)$ to be itself represented as a polynomial of degree $(K-1)$, which can be represented as shown in equation (17):

$$R_1(x) = \sum_{i=0}^{7} r_i x^i. \tag{17}$$

On the one hand, if $r_7 = 0$, then upon performing division by $P(x)$, as represented in equation (16), we obtain:

$$\left\lfloor xR_1 \frac{(x)}{P(x)} \right\rfloor = \sum_{i=0}^{6} r_i x^{i+1} \tag{18}$$

In essence, the remainder $R_1(x)$ is shifted one place to the left. On the other hand, if $r_7 = 1$, then $$\left\lfloor xR_1 \frac{(x)}{P(x)} \right\rfloor = xR_1(x) + P(x). \tag{19}$$

In light of the foregoing, some conclusions are possible. One conclusion is that, if $r_7 = 0$, the new CRC $R_2(x)$ code word is:

$$R_2(x) = \sum_{i=0}^{6} r_i x^{i+1} + a_{-1} + \left\lfloor \frac{a_{39}x^{40}}{P(x)} \right\rfloor \tag{20}$$

As indicated in equation (20), the modified CRC code word is obtained by shifting the previous CRC code word to the left. Then, the new CRC code word is obtained by adding the modified CRC code word, the added set of bits and the function term.

A second conclusion is that, if $r_7 = 1$, then the new CRC $R_2(x)$ code word is:

$$R_2(x) = xR_1(x) + P(x) + a_{-1} + \left\lfloor \frac{a_{39}x^{40}}{P(x)} \right\rfloor \tag{21}$$

As indicated in equation (21), the modified CRC code word is obtained by shifting the previous CRC code word to the left and adding the CRC generator polynomial to it. Then, the new CRC code word is obtained by adding the modified CRC code word, the added set of bits and the function term.

Thus, it is seen from (20) and (21) that the existing CRC $R_1(x)$ code word can be simply modified to compute the new CRC $R_2(x)$ code word. Further, the storage required is minimal, i.e. only two possible values of a function term need be stored in a memory and, as mentioned earlier, the two values are really only one value since the other value is zero, which need not be stored.

If the framing process is implemented on slipping a group of bits, e.g. on eight bits, rather than slipping a single bit, which may be called octet alignment, then the general principles described above can be used to update the existing CRC code word to account for a newly arriving octet and the discarded octet.

Figure 2:
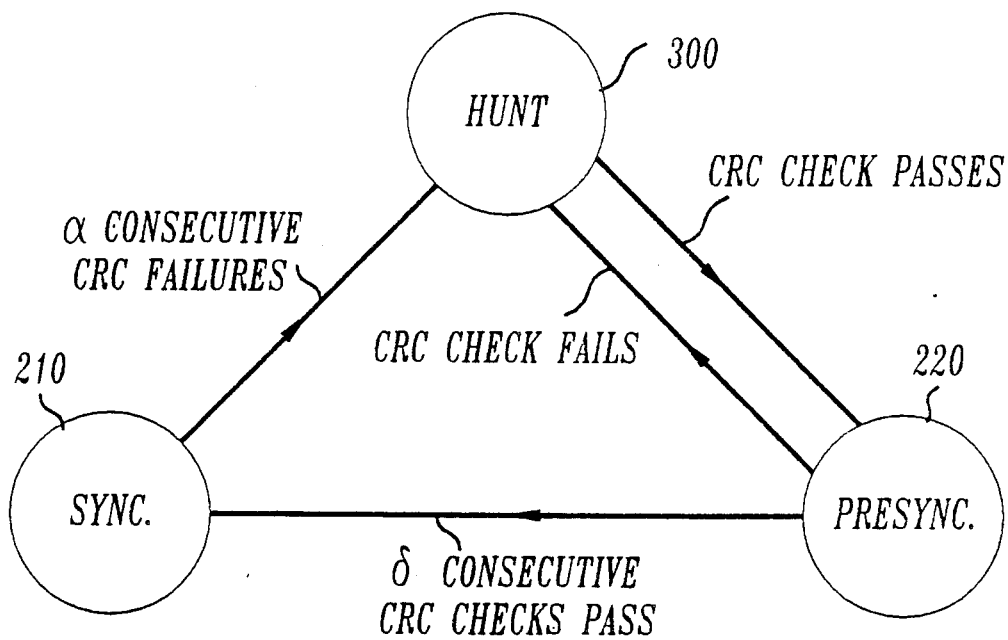
FIG. 2 is a state diagram illustrating a methodology and is useful in describing an illustrative embodiment of the principles of my invention.

Now referring to FIG. 2, the receiver remains in synchronization state 210 as long as the received digital signal includes a CRC code word which matches a locally generated CRC code word. Upon detection of a first predetermined number of mismatches between the received CRC code word and the locally generated CRC code word, the receiver transfers to hunt state 300.

Figure 3:
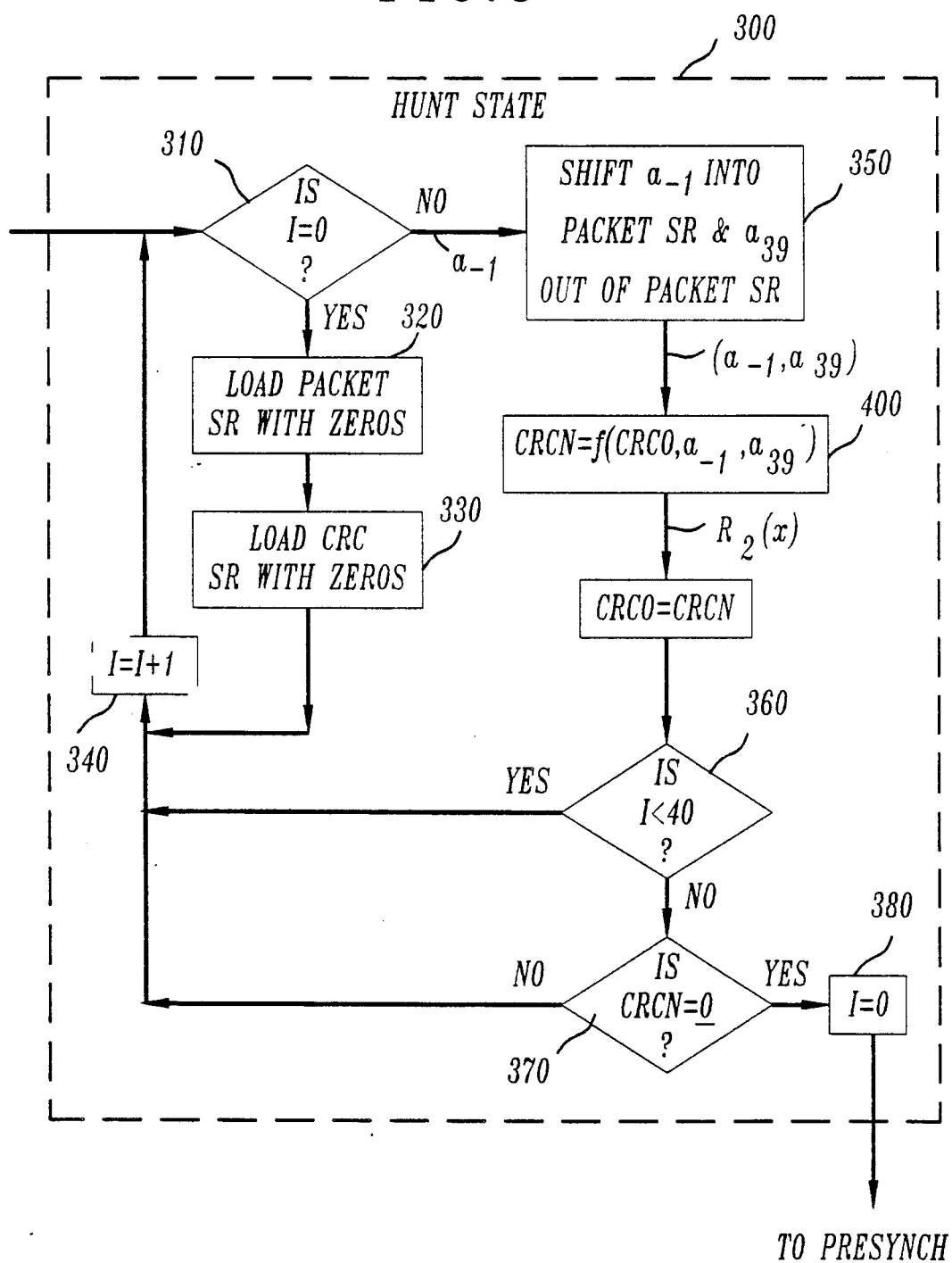
FIG. 3 is a flow diagram of a hunt state shown in FIG. 2 and is useful in describing an illustrative embodiment of the principles of my invention.

Now turn to FIG. 3 for a more specific description of hunt state 300. As mentioned, hunt state 300 is entered upon detection of a predetermined number of CRC code word failures. That is, upon detection in either synchronization state 210 or in presynchronization state 220 of a predetermined number of error code failures, it is assumed that synchronization and that framing must be reestablished. Here we assume that the message length is $(N=)$ 40 bits and that I is a counter, which on entry to hunt state 300 is usually equal to zero. Hence decision 310, in response to $I=0$, initializes two shift registers (SRs), one a packet SR and the other a CRC code word SR, to zero. Thereafter, the $a_{-1}$ bit from message $M_2(x)$ is shifted into the packet SR while the $A_{39}$ bit from message $M_1(x)$ is shifted out of the packet SR, which would then hold message $M_2(x)$, as is shown in FIG. 1. Thereafter, a new CRC code word, called CRCN and also shown as $R_2(x)$, is generated through process 400, which will soon be described by way of FIG. 4, in response to the old CRC code word, called CRCO and also shown as $R_1(x)$. The new CRC code word, CRCN is then substituted for the old CRC code word CRCO. The process iterates through decision 360 until there are at least 40, which is the size of the message, bits over which the new CRC code word is generated.

Note that generating an eight bit CRC code word over a 32 bit message and comparing the thus generated CRC code word with the received CRC code word bits is equivalent to generating a CRC code word over the entire 40 bits including message and CRC code word and comparing it with zero. Accordingly, the hunt state iterates through decision 370 until a new CRC code word CRCN (or $R_2(x)$) of zero is detected whereupon hunt state 300 is exited and the receiver transfers to presynchronization state 220.

Figure 4:
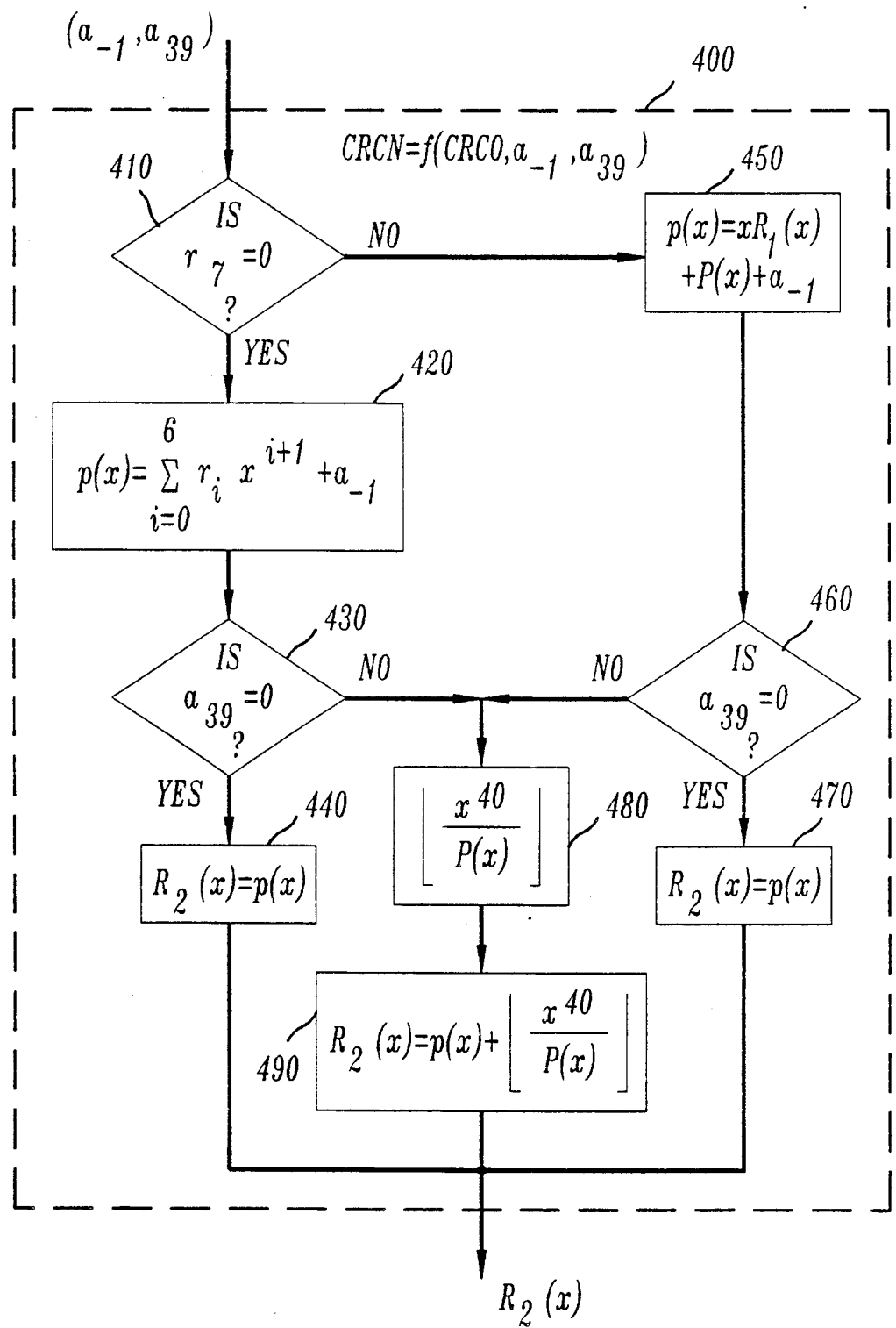
FIG. 4 is a flow diagram of a process in the hunt state shown in FIG. 3 and is useful in describing an illustrative embodiment of the principles of my invention.

Now turning to FIG. 4, we now describe a process 400 of generating a new CRC code word CRCN, or $R_2(x)$, in response to an old CRC code word CRCO, or $R_1(x)$, and in response to the added bit $a_{-1}$ and the dropped bit $a_{39}$. Process 400 has embodied therein the theory noted above, which leads to equation (20) when $r_7$ of remainder $R_1(x)$ is a zero and which leads to equation (21) when $r_7$ of remainder $R_1(x)$ is a one. Accordingly, decision 410 directs the flow to process 450 when $r_7$ is a one and to process 420 when $r_7$ is a zero. In either case a partial sum $p(x)$ is generated. Thereafter, either the partial sum $p(x)$ becomes the new CRC code word CRCN, or $R_2(x)$ when the dropped bit $a_{39}$ is a zero or the partial sum $p(x)$ has added 490 thereto a function update term U, which can be precomputed and stored in memory 480, to generate new CRC code word CRCN, $R_2(x)$.

Again, referring to FIG. 2, upon entry into presynchronization state 220 from hunt state 300, the receiver compares the received CRC code word with the locally generated CRC code word. On the one hand, upon detection of a second predetermined number of matches between the received CRC code word and the locally generated CRC code word, the receiver transfers to synchronization state 210. On the other hand, upon detection of a third predetermined number of mismatches between the received CRC code word and the locally generated CRC code word, the receiver transfers back to hunt state 300.

Figure 5:
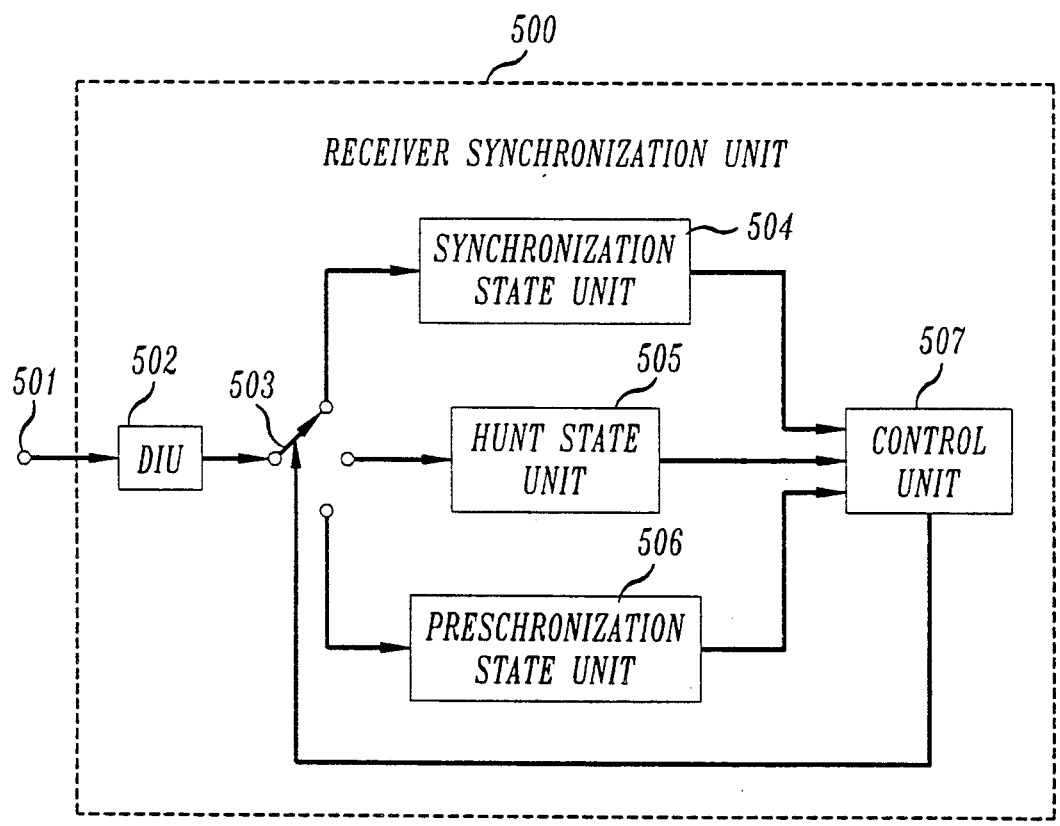
FIG. 5 shows, in simplified block diagram form, a receiver synchronization unit employing an embodiment of the invention.

FIG. 5 shows, in simplified block diagram form, details of receiver synchronization unit 500 including an embodiment of the invention. Receiver synchronization unit 500 includes apparatus for effecting the invention as described above in relationship to FIGS. 2, 3 and 4. Specifically, shown are input 501 adapted to be connected to an incoming transmission path, digital interface unit (DIU) 502, controllable switch 503, synchronization state unit 504, hunt state unit 505, presynchronization state unit 506 and control unit 507. DIU 502 is of a type well known in the art for interfacing to such a digital transmission path. Synchronization unit 504 includes arrangements for locally generating a CRC code word over a portion of the received digital signal and comparing it to an expected CRC code word in the received signal. As indicated above, upon detection of a first predetermined number of mismatches between the locally generated CRC code word and the expected received CRC code word in synchronization state unit 504, control unit 507 causes unit 500 to pass into the hunt state. Consequently, the incoming signal is supplied via switch 503 to hunt state unit 505. Details of operation of hunt state unit 505 are shown in FIGS. 3 and 4 and are described above. Again, as indicated above, new CRC code words are generated, in accordance with the invention, and compared to the expected CRC code word in the received signal until a match is obtained. At such time, the result of obtaining the match is passed to control 507 and switch 503 supplies the incoming signal to presynchronization state unit 506. Again, as indicated above, presynchronization unit 507 compares the locally generated CRC code word to the expected CRC code word in the received signal. Upon detection of a second predetermined number of matches between the locally generated CRC code word and the expected received CRC code word, control 507 causes switch 503 to supply the received signal to synchronization state unit 504 and the received signal is in synchronization with the receiver. However, upon detection by presynchronization state unit 506 of a third predetermined number of mismatches between the locally generated CRC code word and the expected CRC code word in the received signal, control 507 passes control back to hunt state unit 505. To this end, control 507 causes switch 503 to supply the received signal to hunt state unit 505. The operation of hunt state unit 505 and presynchronization state unit 506 is then iterated, until synchronization is detected and synchronization state unit 504 is active.

Although the invention has been described and illustrated in detail, it is to be understood that the above description is presented primarily for the purpose of illustration and example. For brevity, only some alternative functions, for example, have been described. Still other functions and other variations of the principles of the invention will occur to those skilled in the art. Accordingly, the invention is not limited by the embodiments shown and described, but only by the appended claims.

I claim:

1. A method for synchronizing a received digital signal with a receiver in a communications network, the received digital signal including an error check code word, the method comprising the steps of:

interfacing to a transmission path to receive a digital signal;

generating an error check code word over a prescribed portion of the received digital signal;

comparing the generated error check code word with an expected error check code word in the received digital signal;

in response to a result of the comparing, generating a new error check code word as a function of a last previously generated error check code word, a dropped set of bits from the prescribed portion of the received digital signal and an added set of bits to the prescribed portion of the received digital; and detecting synchronization between the generated error check word and the expected error check word in the received signal, said step of detecting including in response to the result of the comparing, iterating the steps of generating the new error check code word and comparing as needed to achieve synchronization.

2. The method as defined in claim 1 wherein said error check code word comprises a cyclic redundancy check (CRC) code word.

3. The method as defined in claim 2 wherein said set of bits includes at least one (1) bit.

4. The method as defined in claim 2 wherein set of bits includes more than one (1) bit.

5. The method as defined in claim 2 wherein said step of generating said new error check code word includes the steps of generating a modified version of said previous error check code word, generating a function term representative of a modified version of said dropped set of bits and adding said modified error check code word, said function term and said added set of bits.

6. The method as defined in claim 5 wherein the step of generating said function term includes the steps of modifying said dropped set of bits by a predetermined mathematical function to obtain a modified version of said dropped set of bits and dividing said modified version of said dropped set of bits by a predetermined CRC generator polynomial.

7. The method as defined in claim 6 wherein the step of modifying said dropped set of bits includes the step of multiplying said dropped set of bits by mathematical function which comprises a predetermined polynomial.

8. The method as defined in claim 7 wherein the predetermined polynomial is a predetermined monomial.

9. The method as defined in claim 5 wherein said step of generating said modified version of said previous error check code word includes the step of shifting said previous error check code word to the left dependent on a lead set of bits in said previous error check code word.

10. The method as defined in claim 5 wherein said step of generating said modified version of said previous error check code word includes the steps of shifting said previous error check code word to the left and adding the predetermined CRC generator polynomial to the shifted previous error check code word dependent on the lead set of bits in the previous error check code word.

11. Apparatus for synchronizing a received digital signal with a receiver in a communications network, the digital signal including an error check code word, the apparatus comprising:
   means for interfacing to a transmission path to receive a digital signal;
   means for generating an error check code word over a prescribed portion of said received digital signal;
   means for comparing the generated error check code word with an expected error check code word in the received digital signal;
   means responsive to a result of the comparison for generating a new error check code word as a function of a previous error check code word generated over a prescribed portion of the received signal, a dropped set of bits form said prescribed portion of the received digital signal and an added set of bits to said prescribed portion of the received digital signal; and
   means for detecting synchronization between the generated error check word and the expected error check word in the received signal, said means for detecting including means responsive to the result of the comparison for iterating the generation of the new error check code word and the comparison as needed to achieve the synchronization of the received digital signal with the receiver.

12. The apparatus as defined in claim 11 wherein said error check code word comprises a cyclic redundancy check (CRC) codeword.

13. The apparatus as defined in claim 12 wherein said set of bits includes at least one (1) bit.

14. The apparatus as defined in claim 12 wherein said set of bits includes more than one (1) bit.

15. The apparatus as defined in claim 12 wherein said means for generating said new error check code word includes means for generating a modified version of said previous error check code word, generating a function term representative of a modified version of said dropped set of bits and means for adding said modified version of said previous error check code word, said function term and said added set of bits.

16. The apparatus as defined in claim 15 wherein said means for generating said function term includes means for modifying said dropped set of bits by a predetermined mathematical function to obtain a modified version of said dropped set of bits and means for dividing said modified version of said dropped set of bits by a predetermined CRC generator polynomial.

17. The apparatus as defined in claim 16 wherein said means for modifying said dropped set of bits includes means for multiplying said said dropped set of bits by said mathematical function which comprises a predetermined polynomial.

18. The apparatus as defined in claim 17 wherein said predetermined polynomial is a monomial.

19. The apparatus as defined in claim 16 wherein said predetermined set of bits comprises one (1) bit.

20. The apparatus as defined in claim 16 wherein said predetermined set of bits comprises more than one (1) bit.

21. The apparatus as defined in claim 12 wherein said means for generating said modified version of said previous error check code word includes means for shifting said previous error check code word to the left dependent on a lead set of bits in said previous error check code word.

22. The apparatus as defined in claim 12 wherein said means for generating said modified version of said previous error check code word includes means for shifting said previous error check code word to the left and means for adding the predetermined CRC generator polynomial to the shifted previous error check code word dependent on the lead set of bits in the previous error check code word.

* * * * *

UNITED STATES PATENT AND TRADEMARK OFFICE
CERTIFICATE OF CORRECTION

PATENT NO. : 5,131,012
DATED : July 14, 1992
INVENTOR(S) : Subrahmanyam Dravida

It is certified that error appears in the above-identified patent and that said Letters Patent is hereby corrected as shown below:

In the Abstract, line 11, "iteratged" should read -- iterated --.

Column 3, line 62, "i $P(x) = x^8 + x^2 + x^1 + 1$" should read
-- $P(x) = x^8 + x^2 + x^1 + 1$ --;

Signed and Sealed this

Sixteenth Day of November, 1993

Attest:

BRUCE LEHMAN

Attesting Officer

Commissioner of Patents and Trademarks